United States Patent
Roizin et al.

(10) Patent No.: US 9,917,104 B1
(45) Date of Patent: Mar. 13, 2018

(54) HYBRID MOS-PCM CMOS SOI SWITCH

(71) Applicants: Tower Semiconductor Ltd., Migdal Haemek (IL); Newport Fab, LLC, Newport Beach, CA (US)

(72) Inventors: Yakov Roizin, Afula (IL); David J. Howard, Irvine, CA (US); Paul D. Hurwitz, Irvine, CA (US)

(73) Assignees: Tower Semiconductor Ltd., Migdal Haemek (IL); Newport Fab LLC, Newport Beach, CA (US)

( * ) Notice: Subject to any disclaimer, the term of this patent is extended or adjusted under 35 U.S.C. 154(b) by 0 days.

(21) Appl. No.: 15/627,261

(22) Filed: Jun. 19, 2017

(51) Int. Cl.
*H04B 1/04* (2006.01)
*H01L 27/12* (2006.01)
*H01L 29/06* (2006.01)
*H01L 45/00* (2006.01)

(52) U.S. Cl.
CPC ...... *H01L 27/1203* (2013.01); *H01L 29/0649* (2013.01); *H01L 29/0676* (2013.01); *H01L 45/06* (2013.01); *H04B 1/0483* (2013.01)

(58) Field of Classification Search
CPC ............. H01L 27/1203; H01L 29/0649; H01L 29/0676; H01L 45/06; H04B 1/0483
USPC ....................................................... 455/129
See application file for complete search history.

(56) References Cited

U.S. PATENT DOCUMENTS

| | | | |
|---|---|---|---|
| 9,293,699 B1 | 3/2016 | Moon | |
| 9,362,492 B2 | 6/2016 | Goktepeli et al. | |
| 9,368,720 B1 | 6/2016 | Moon | |
| 2004/0113134 A1* | 6/2004 | Gill | G11C 13/0004 257/2 |

FOREIGN PATENT DOCUMENTS

WO 2016028362 A2 6/2015

OTHER PUBLICATIONS

S. Raoux, et al, "Crystallization characteristics of Ge—Sb and Ge—Te phase change materials," EPCOS, pp. 91-98, Sep. 2009.

(Continued)

*Primary Examiner* — Sanh Phu
(74) *Attorney, Agent, or Firm* — Bever, Hoffman & Harms, LLP (57) ABSTRACT

A hybrid MOS-PCM IC switch utilizes both MOS transistors and groups of parallel-connected Phase-Change Material (PCM) cells to control signal transmissions. The MOS transistors are separated by PCM cell groups, and the PCM cells are configured to generate similar $C_{OFF}$ or lower values as the MOS transistors, whereby the hybrid switch is both smaller and exhibits lower FOM than standard CMOS SOI switches. When switched into an open (OFF/high-resistance) state, both the PCM cells and MOS transistors function to distribute high VBSR voltages, and the MOS transistors prevent unintended phase changes (ON/OFF switching) of the PCM cells by preventing exponential current flow. In the closed (ON/conducting) state, the PCM cells facilitate lower total $R_{ON}$, whereby the hybrid CMOS SOI switch achieves improved FOM. The MOS transistors may also function as drivers during programming (switching) of direct-heating-type PCM cells.

19 Claims, 7 Drawing Sheets

(56) References Cited

OTHER PUBLICATIONS

Y. Shim at.al "RF switches using phase change materials" IEEE MEMS 2013.
K. Chua "Development of Phase Change Switches with Low Resistance in the ON state", PhD Thesis Carnegie Mellon University, PA, 2011.
N. Hinnawy, et.al. "Improvements in GeTe-Based Inline Phase-Change Switch Technology for RF Switching Applications", Compound Semiconductor MANTECH 2014.
J. Moon, "11 THz Figure-of-Merit Phase-change RF Switches for Reconfigurable Wireless Front-ends", IMS 2015.

* cited by examiner

HYBRID MOS-PCM CMOS SOI SWITCH

FIELD OF THE INVENTION

This invention relates to integrated circuit (IC) switches, and more particularly to CMOS SOI radio frequency (RF) switches.

BACKGROUND OF THE INVENTION

In the semiconductor industry, a phase-change material (PCM) is a material that is capable of quickly changing between a high-resistance (low-conductivity) state and a low-resistance (high-conductivity) state. A commonly used PCM is chalcogenide glass, which generally refers to inorganic polymers of sulfur, selenium and tellurium that are able to change between an amorphous high-resistance state and a crystalline low-resistance state. Although many chalcogenide glass materials have been studied, most current practical PCM-based IC devices use an alloy comprising Germanium-Antimony-Tellurium (GST). Transitions between low resistance crystalline and high resistance amorphous states are performed either by direct heating of the PCM element (i.e., by passing current pulses of different lengths and amplitudes through the chalcogenide glass material), or by indirect heating of the PCM element (i.e., by passing long and short current pulses through heater elements that are adjacent to the chalcogenide glass material). In either case, the chalcogenide glass is transitioned into its amorphous state using relatively short duration heating and quenching cycles, and the chalcogenide glass is transitioned into its crystalline state using relatively long duration heating and cooling cycles.

The use of PCMs in IC devices dates back to the 1960's, when phase-change random-access memory (PRAM) devices were first introduced. PRAMS and other type of phase-change memory are non-volatile random-access memory (NVM) devices that utilize PCM elements to store data. Each PCM-based NVM cell typically includes a PCM element connected between two electrodes in either a vertical via-type configuration or a horizontal configuration (e.g., with the electrodes formed in the same plane as a chalcogenide film). Data is written/stored by way of causing the PCM element to enter a SET (low resistance crystalline) state or a RESET (high resistance amorphous) state, whereby the data could be subsequently read, e.g., by measuring the resistance of the PCM element.

More recently, PCM-based RF switches were introduced that take advantage of the high OFF/ON resistance ratios exhibited by certain chalcogenide films. Compared with NVM, RF switches require a higher ratio of OFF/ON resistances and lower ON state resistances, and it was recognized that certain GeTe chalcogenide films provided up to $10^6$ OFF/ON resistance ratios (see, e.g., S. Raoux, et al. "Crystallization characteristics of Ge—Sb and Ge—Te phase change materials," EPCOS, pp. 91-98, September 2009; Y. Shim at. al "RF switches using phase change materials "IEEE MEMS 2013; K. Chua "Development of Phase Change Switches with Low Resistance in the ON state", PhD Thesis Carnegie Mellon University, PA, 2011; N. Hinnawy, et. al. "Improvements in GeTe-Based Inline Phase-Change Switch Technology for RF Switching Applications", Compound Semiconductor MANTECH 2014; J. Moon, "11 THz Figure-of-Merit Phase-change RF Switches for Reconfigurable Wireless Front-ends", IMS 2015). In PCM-based RF switch parlance, OFF state refers to the disordered high-resistance amorphous phase corresponding to the RESET state in NVM terminology, and the ON state refers to the ordered low-resistance crystalline phase corresponding to the SET state in NVM terminology. PCM-based RF switches are transitioned into the OFF state using relatively short heating and cooling cycles, and can be brought back into the ON state by way of longer heating and slower cooling cycles (i.e., to facilitate crystallization). Similar to the case of PCM-based NVM cells, heating of the PCM material in a PCM-based RF switch can be achieved using external heaters, or by way of forcing currents through the chalcogenide glass.

PCM-based RF switches are taught in various patent publications. U.S. Pat. No. 9,368,720 teaches a switch with single phase change material element connected between the switch's input and output ports, a heater, and a thermal dielectric layer (e.g., AlN, diamond or SiC) in between the heater and the phase change material. U.S. Pat. No. 9,293,699 teaches a device similar to that of U.S. Pat. No. 9,368,720, but switching is implemented using a direct current sent through the phase change material (i.e., instead of using a separate heater). PCT publication WO2016028362 also describes another direct heating switch including two electrodes used for RF switch channel operations (i.e., to pass the RF signal), and two additional electrodes for direct heating. The heating element electrodes are configured to draw a current through the same phase change element in a direction transverse to the conductive path used by the RF switch channel. U.S. Pat. No. 9,362,492 teaches integrated phase change switches, including switches connected in series for antenna applications. Auxiliary CMOS circuitry associated with the RF switches is integrated together with phase change switches in the back-end of a CMOS process flow. It is noted that the CMOS transistors serve only as elements of the control circuits, and do not form part of the RF signal paths (i.e., the RF signals only pass through the phase change switches, not through any CMOS transistors).

A problem with the use of the conventional PCM-based RF switches set forth above in antenna applications is that the high power generated across the RF switches can result in undesirable switching when direct-heating-type PCM cells are used. That is, the voltage generated across an OFF-state RF switch branch between the antenna and a transceiver circuit can exceed 50V, especially in cases of impedance mismatch. For example, for the input power of 38 dBm and vertical standing wave ratio (VSWR) of 5:1, the off state antenna branches may be subject to 55V. Because RF switches using direct-heating-type GeTe PCM cells feature transition between the OFF state and the ON state at voltages in the range of 1V to 5V, and at currents on the order of milliamperes, such high voltages generated across an OFF state RF switch can result in undesirable switching of the RF switch to the ON state, rendering the RF switch inoperable.

To avoid the undesirable OFF-to-ON switching problem in RF switches using direct-heating-type PCM cells, a PCM-only RF switch must include multiple PCM cells connected in stacked arrangement (i.e., connected in series) in order to keep the effective voltage across each PCM cell below the PCM cells' threshold/switching voltage. This series-connected PCM cell approach effectively distributes large voltages evenly across the PCM cells in a manner similar to that utilized to prevent damage to MOS transistors in CMOS SOI switches. However, to implement this approach in antenna branch capable of withstanding 55V, dozens of PCM cells must be connected in series. For example, if an RF switch was fabricated using PCM cells having 3V threshold voltages, about twenty connected-in-series PCM cells would be required to keep the voltage across each PCM cell below 3V. Moreover, because the switch's ON-resistance $R_{ON}$ is proportional to the number of series-connected PCM cells, and assuming the ON-resistance of a single PCM element on the order of 1 Ohm, additional PCM cells would also have to be connected in parallel with the series-connected chain to reduce the effective ON-resistance of the chain. That is, the only practical way to form RF switches using only direct-heating-type PCM cells is to form arrays of series-and-parallel-connected PCM cells. However, tens of PCMs would be needed to be connected in parallel with the twenty or more connected-in-series PCM cells in order to keep insertion losses at the level of $R_{ON}$ produced by a comparable CMOS SOI RF switch (i.e., a CMOS SOI RF switch capable of withstanding 55V). Accordingly, there is little incentive for replacing a relatively high voltage (i.e., above about 15V) CMOS SOI RF switch with a PCM-only RF switch.

Another problem is associated with the distinguishing property of direct-heating-type PCM cells called "threshold switching. Without low (at the level of several volts) thresholds, very high voltages would be required to switch the chalcogenide films from high resistance OFF state to the low resistance ON state. The resistance of the OFF state exponentially decreases when the threshold voltage is approached. Switching is a two-stage process: at the first stage, conductivity is increased (i.e., due to Pool-Frenkel effect, carrier multiplication, intermediate phase change, etc.), causing the active component of the amorphous phase impedance to decrease. The drop of the PCM cell's active resistance leads to high currents (second stage of switching), and then heating results in chalcogenide melting. Compared with MOS transistors entering the punch-through regime, the situation with PCM cells is more dangerous: while avalanche in MOS device may be reversible (i.e., linearity of the switch may be degraded for some time, but then recover), switching of a PCM cell is irreversible and leads to switching of other PCMs in the antenna branch. The typical way to preclude this situation is to include additional PCM cells in the chain. However, with large numbers of PCM cells in a branch, very high "on chip" voltages are required for PCM switching. If voltages for switching are applied to individual PCM cells, leakage passes for RF signal are introduced, although decoupling resistors may be used to limit the values of current that could be forced through the PCM cells.

Although some of the problems associated with direct-heating-type PCM cells mentioned above may be avoided by utilizing indirect-heating-type PCM cells, this alternative approach generates other problems. For example, in RF switches using indirect-heating-type PCM cells, typical currents required to effect switching of the PCM cells are on the order of 20-50 mA (about 10 time higher than for direct switching). This high current demand requires high power drivers, which requires special (non-standard) metallization. Also, using external heaters is expensive, since assumes additional process steps, in particular integration of heat conductive dielectrics.

What is needed is an IC switch that avoids the problems set forth above. In particular, what is needed is a CMOS SOI RF switch that takes advantage of the beneficial qualities associated with the use of PCM cells (i.e., high OFF/ON resistance ratios and low ON resistance) without incurring the problems encountered by conventional PCM-only approaches.

SUMMARY OF THE INVENTION

The present invention is generally directed to hybrid MOS-PCM IC switches that utilize both series-connected MOS transistors and parallel-connected switching elements to control a signal path. In a presently preferred embodiment, each of the parallel-connected switching elements includes a Phase Change Material (PCM) structure connected between two electrodes, wherein the PCM structure is switchable between a low-resistance (high-conductivity) ON state and a high-resistance (low-conductivity) OFF state by way of an applied control signal. The IC switch is turned on by supplying a PCM-ON control signal to the parallel-connected switching elements and a MOS-ON control signal to the MOS transistors, wherein the PCM-ON control signal operably causes the PCM structures to enter their low-resistance (crystalline) state, and the MOS-ON control signal places the MOS transistors in a conductive (ON) state, whereby signals are passed with relatively low impedance along the signal path through both the MOS transistors and the parallel-connected switching elements. Subsequent transition of the IC switch from the ON state to an OFF state involves applying a PCM-OFF control signal to the parallel-connected switching elements that operably causes the PCM structures to enter their high-resistance (amorphous) state, and by applying a MOS-OFF gate voltage (e.g., 0V) to turn off the MOS transistors, whereby IC switch impedes signal transmissions along the signal path. By combining both MOS transistors and parallel-connected switch elements (PCM cells) in the manner set forth above, the present invention provides a "hybrid" MOS-PCM IC switch that exhibits several advantages over conventional IC switches based on MOS-only and PCM-only configurations.

A first advantage provided by the hybrid MOS-PCM switches of the present invention is that, by replacing one or more MOS transistors of a conventional MOS-only switch with one or more groups of parallel-connected PCM cells (switching elements), the hybrid MOS-PCM switches achieve a strongly improved Figure of Merit (FOM) over conventional MOS-only switches. The FOM of a given switch is calculated by multiplying the switch's OFF-capacitance $C_{OFF}$ with the switch's ON-resistance $R_{ON}$, and indicates the switch's quality by reflecting insertion losses in the ON state and isolation in the OFF state. Because each individual PCM cell has a smaller $C_{OFF}$ and a comparable $R_{ON}$ to the types of MOS transistor utilized in IC switches, it is possible to parallel-connect two or more PCM cells in a way that produces the same or lower total $C_{OFF}$ while significantly reducing $R_{ON}$ (i.e., because the total resistance of n parallel connected resistors having resistances R is R/n). The hybrid MOS-PCM switches of the present invention achieve a strongly improved Figure of Merit (FOM) over comparable conventional MOS-only switches by way of utilizing the parallel-connected PCM cells (switching elements) to significantly reduce the switch's overall $R_{ON}$ while (maintaining or possibly reducing) the switch's overall $C_{OFF}$.

A second advantage provided by the hybrid MOS-PCM switches of the present invention is that, by connecting one or more MOS transistors in series with one or more groups of parallel-connected PCM cells (switching elements), the resulting hybrid MOS-PCM switch avoids the various problems associated with conventional PCM-only switches. That is, even though the number of MOS transistors is reduced in comparison to MOS-only switches, the smaller number of MOS transistors still function to prevent exponential current increases caused by voltage overshoots when the hybrid MOS-PCM switch is in its off state, thereby suppressing heat generation in the PCM cells that can lead to undesirable amorphous-to-crystalline state changes. By utilizing the MOS transistors to suppress exponential currents, the present invention avoids the need for the stacked arrangement required by conventional PCM-only switches to keep the effective voltage across each PCM cell below the PCM cells' threshold/switching voltage. This in turn avoids the need for special high-voltage fabrication techniques by facilitating PCM switching at reasonable voltage levels.

A third advantage provided by the hybrid MOS-PCM switches of the present invention is that, by combining MOS transistors and parallel-connected PCM cell groups in the manner descried above, the hybrid MOS-PCM switches of the present invention are made more compact and exhibit improved linearity and harmonic performance in comparison to conventional IC switches. That is, because the parallel-connected PCM cells occupy substantially less chip-area space than MOS transistors, replacing one or more MOS transistors of a conventional MOS-only switch with parallel-connected PCM cells makes hybrid MOS-PCM switches significantly smaller (more compact) in comparison to conventional MOS-only switches. Hybrid MOS-PCM switches also achieve reduced parasitic losses caused by substrate currents in comparison to MOS-only switches due to their smaller chip-area size, because the number of MOS transistors is reduced (i.e., substrate currents, are less important for voltage balance on MOS transistors and PCM elements). That is, replacing one or more MOS transistors of a conventional MOS-only switch with parallel-connected PCM cells reduces substrate parasitic losses, thereby allowing hybrid MOS-PCM switches to achieve more uniform voltage distribution, which provides the hybrid MOS-PCM switches with improved linearity and harmonic performance in comparison to conventional MOS-only switches. Moreover, by utilizing PCM cells having threshold voltages that are below the MOS transistors' breakdown voltage, the PCM cells also function to protect the MOS transistors from damage due to high voltage potentials applied across the switch during OFF state conditions.

As illustrated by the advantages set forth above, the parallel-connected PCM cell groups and MOS transistors function symbiotically to provide the hybrid MOS-PCM switches of the present invention with a more compact size, strongly improved FOM, and improved operating characteristics that cannot be achieved using conventional MOS-only or PCM-only approaches. Stated differently, the hybrid MOS-PCM RF switches of the present invention provide the advantages of conventional PCM-only switches (i.e., low $R_{ON}$ and low $C_{OFF}$), and at the same time avoid the problem of low immunity to high voltages, which leads to the larger numbers of series-connected PCM cells required by conventional PCM-only switches, which in turn leads to the above-mentioned driver and power consumption issues associated with conventional PCM-only switches.

According to an exemplary embodiment of the present invention, a hybrid CMOS silicon-on-insulator (SOI) RF switch is disclosed that can be fabricated using conventional CMOS SOI fabrication techniques. In this embodiment, at least two MOS transistors are respectively fabricated on separate silicon-on-insulator (SOI) islands surrounded by a suitable isolation material (e.g., shallow trench isolation (STI)), with a small number (e.g., two to ten) of parallel-connected switching elements (PCM cells) formed on a section of dielectric layer material that is disposed above and between the MOS transistors (i.e., over an intervening STI region between the separate SOI islands). The PCM cells are connected in parallel between a drain diffusion (terminal) of one MOS transistor and a source diffusion (terminal) of the second MOS transistor by way of contact vias and first metal structures. In one embodiment, the PCM cells (switching elements) are configured to collectively apply a (second) OFF-capacitance to the signal path when all of the parallel-connected PCM cells are in their high-resistance (OFF) state such that the (second) OFF-capacitance is substantially equal (i.e., ±10% or less) to or less than a (first) OFF-state capacitance of each MOS transistor. In one embodiment, the PCM cells (switching elements) are configured such that a ratio of their OFF-resistance (i.e., resistance in their high-resistance amorphous state) to their ON-resistance (i.e., resistance in their low-resistance crystalline state) is greater than 1,000 and preferably greater than 10,000, which can be achieved by way of implementing the PCM cells using a suitable chalcogenide glass material such as GeTe. By utilizing the various features set forth above, and by using a suitable number of SOI MOS transistors and groups of parallel-connected PCM-based switching elements, the present invention facilitates the fabrication of CMOS SOI RF switches capable of withstanding high OFF state voltages (e.g., greater than 50V) while exhibiting the performance and cost benefits set forth above.

According to presently preferred embodiments, the PCM cells include chalcogenide glass-based switching elements (i.e., a chalcogenide glass structure connected between two electrodes). Although switching elements comprising Germanium and Tellurium (e.g., GeTe) are presently preferred, the PCM cells may be fabricated using other chalcogenide glass materials (e.g., Germanium-Selenium (GeSe) or Selenium-Tellurium (SeTe)), provided the alternative chalcogenide glass material exhibits the required switching characteristics mentioned above (e.g., such that it produces an $R_{ON}/R_{OFF}$ ratio having a value greater than 10,000). Moreover, the present inventors believe the PCM cells may be implemented using other materials and/or configurations that exhibit the required switching characteristics mentioned above, such as one or more of the materials and configurations currently utilized in back end nonvolatile memories such as ReRAMs (e.g., titanium dioxide, polymeric materials, ferroelectric materials, carbon nanotubes, layered configurations, etc.). By selecting a suitable switching element for a given switch application based on optimal performance and minimal manufacturing cost (e.g., by way of minimizing changes to an existing fabrication flow), a wide range of beneficial switches may be produced based on the novel concepts of the present invention.

According alternative embodiments, the novel switches of the present invention may be produced using either indirect-heating-type or direct-heating-type PCM cells (switching elements), and using a variety of PCM cell configurations. In one embodiment, switches produced with indirect-heating-type PCM cells include Tungsten (W) heater elements that are configured to heat GeTe (or other chalcogenide glass material) switching structures in response to applied switching voltage signals during ON-to-OFF or OFF-to-ON switching operations. In a specific embodiment, each PCM cell includes a thermally conductive material structure (e.g., Aluminum-Nitride) disposed under its heater element and its switching structure. In a presently preferred direct-heating embodiment, each PCM cell is configured to switch conductive states in response to an applied switching voltage that is passed to the PCM cell from an adjacent MOS transistor. That is, the MOS transistors function both as ON/OFF switch elements (e.g., to pass or block RF signal transitions), and also as power devices during PCM switching operations. By positioning one parallel-connected PCM cell group between each adjacent pair of MOS transistors, the voltage required to switch the PCM cells is greatly reduced over conventional approaches, thereby avoiding the need to include additional masks and/or special high-voltage circuitry to an existing (e.g., CMOS) fabrication flow). In alternative embodiments, each PCM cell is fabricated using either a horizontal/planar configuration, a vertical configuration, and a nanowire configuration, where the PCM cell type selection is based on the various performance and cost considerations mentioned herein.

In another exemplary embodiment, a hybrid MOS-PCM RF switch is configured as a replacement for a conventional MOS-only CMOS SOI switch that utilizes eight series-connected MOS transistors and is configured to withstand 25V VSWR. The hybrid MOS-PCM RF switch utilizes four series-connected MOS transistors and four PCM cell groups, where each MOS transistor is identical to each MOS transistor of the conventional MOS-only switch, and each PCM cell group includes five parallel connected PCM cells. According to a presently preferred embodiment, the MOS transistors and PCM cell groups are arranged in an alternating manner, with three of the PCM cell groups respectively disposed in the gap regions separating adjacent pairs of the four MOS transistors, and with one PCM cell group disposed between an end MOS transistor and an output terminal of the switch. An advantage of this arrangement is that, due to the smaller size of the parallel connection of the PCM cells, the PCM cell groups may be introduced between the adjacent pairs of MOS transistors without increasing the transistor-to-transistor spacing required in the MOS-only switch. Accordingly, the hybrid MOS-PCM RF switch effectively facilitates the omission (removal) of half of the series connected MOS transistors required in the MOS-only switch, resulting in an approximately 50% reduction in chip area size. Moreover, replacing the omitted MOS transistors with parallel-connected PCM cell groups significantly reduces the switch's total $R_{ON}$, resulting in an approximately 50% reduction in FOM in comparison to the comparable conventional MOS-only switch without compromising high power RF handling and high power consumption in switching.

According to another exemplary embodiment, a hybrid MOS-PCM antenna switch circuit includes multiple branches configured to control various signal paths between an antenna, a transmitter circuit and a receiver circuit, where each branch includes a hybrid MOS-PCM switch of the type described above. A control circuit transmits switch control signals that operably turn on/off the branches/switches such that, in a transmission (first) operating state, a first branch is turned on to provide a low-resistance path between the transmitter circuit and the antenna, and a second branch is turned off to form a high-resistance path between the receiver circuit and the antenna. Conversely, in a reception (second) operating state, the second branch is turned on to form a low-resistance path between the receiver circuit and the antenna, and the first branch is turned off to form a high-resistance path between the transmitter circuit and the antenna. In addition to the first and second branches, shunt branches are respectively provided between the transmitter and receiver circuits and ground, and are turned on/off to increase isolation of the transmitter or receiver circuits when not in use. To further improve isolation, the gates and sources/drains of the MOS transistors in each hybrid MOS-PCM switch are biased negatively through large resistors (e.g., 10 kOhm-50 kOhm).

BRIEF DESCRIPTION OF THE DRAWINGS

These and other features, aspects and advantages of the present invention will become better understood with regard to the following description, appended claims, and accompanying drawings, where:

FIGS. 5(A) and 5(B) are top plan views showing the conventional MOS-only and hybrid MOS-PCM RF switches of FIGS. 4(A) and 4(B), respectively.

DETAILED DESCRIPTION OF THE DRAWINGS

The present invention relates to an improvement in IC switches. The following description is presented to enable one of ordinary skill in the art to make and use the invention as provided in the context of a particular application and its requirements. As used herein, directional terms such as "above", "below" and "between", are intended to provide relative positions for purposes of description, and are not intended to designate an absolute frame of reference. In addition, the terms "coupled" and "connected", as utilized herein, are defined as follows. The term "connected" is used to describe a direct connection between two circuit elements, for example, by way of a metal line formed in accordance with normal integrated circuit fabrication techniques. In contrast, the term "coupled" is used to describe either a direct connection or an indirect connection between two circuit elements. For example, two coupled elements may be directly connected by way of a metal line, or indirectly connected by way of an intervening circuit element (e.g., a capacitor, resistor, inductor, or by way of the source/drain terminals of a transistor). Various modifications to the preferred embodiment will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

Figure 1:
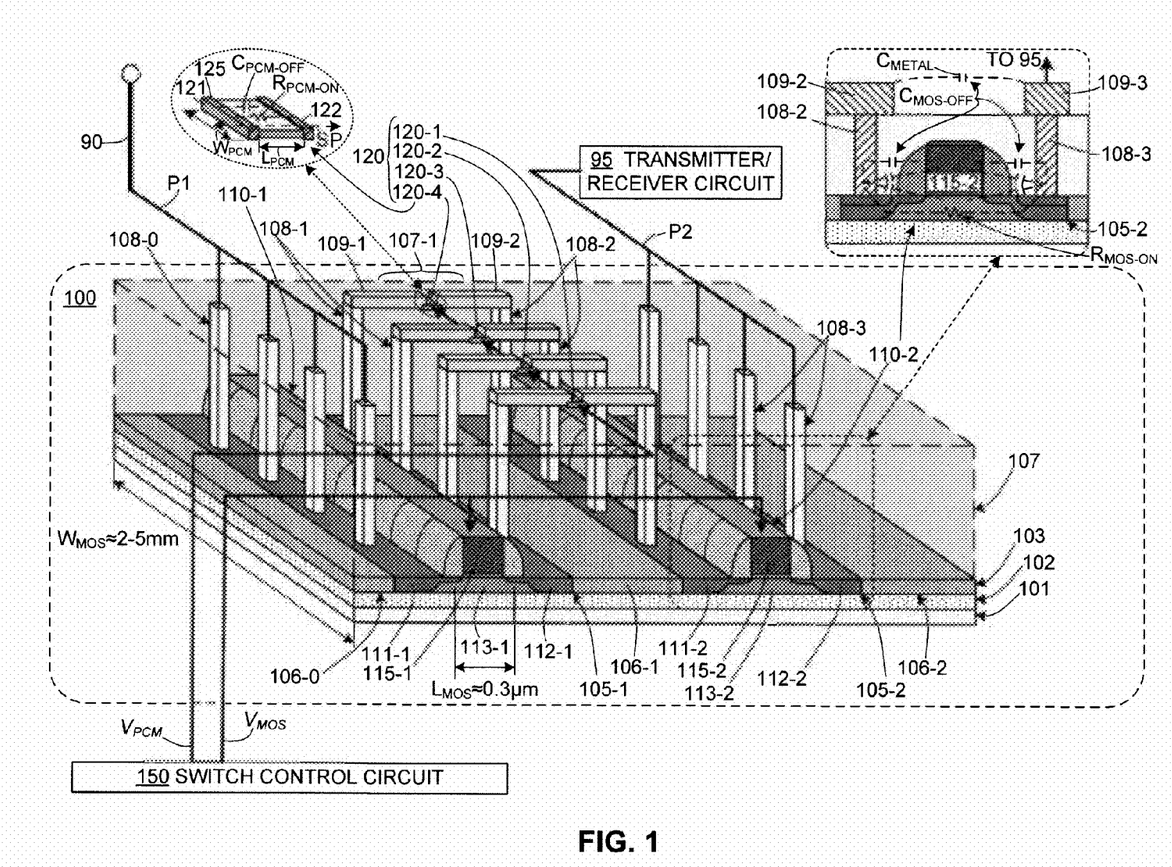
FIG. 1 is a top side perspective view showing a hybrid MOS-PCM switch according to a simplified exemplary embodiment of the present invention.

FIG. 1 shows an exemplary hybrid MOS-PCM SOI radio frequency (RF) switch 100 having a first port P1 coupled to an antenna 90 and a second port P2 coupled to a transceiver 95 (i.e., either a transmitter circuit or a receiver circuit), whereby switch 100 is disposed in a signal path between antenna 90 and transceiver 95, and functions to selectively transmit (or block) RF signals between antenna 90 and transceiver 95. Switch 100 includes two Metal-Oxide-Silicon (MOS) transistors 110-1 and 110-2 that are connected in series in the signal path, and four switching elements 120-1 to 120-4, which are collectively referred to as a group 120, that are connected in parallel in the signal path. Switch 100 is configured to control the transmission of signals between antenna 90 and transceiver 95 in accordance with switch control signals $V_{MOS}$ and $V_{PCM}$, which are generated by a control circuit 150 and respectively control the ON and OFF states of MOS transistors 110-1 and 110-2 and switching elements 120-1 to 120-4 in the manner described below. Switch 100 enters a closed/ON (low-resistance) state when both MOS transistors 110-1 and 110-2 and switching elements 120-1 to 120-4 are operably controlled by switch control signals $V_{MOS}$ and $V_{PCM}$ to respectively enter closed/ON (low-resistance) states. Conversely, switch 100 enters an open/OFF (high-resistance) state when both MOS transistors 110-1 and 110-2 and switching elements 120-1 to 120-4 are operably controlled by switch control signals $V_{MOS}$ and $V_{PCM}$ to respectively enter in open/OFF (high-resistance) states. By alternating between the generation of ON and OFF control signals, switch 100 is controlled by control circuit 150 to pass and block signal transmissions along a signal path between antenna 90 and transceiver 95.

In a presently preferred embodiment switch 100 is fabricated on a Silicon-On-Insulator (SOI) substrate including a base substrate 101, and insulator layer 102, a Silicon-On-Insulator (SOI) layer 103 formed on insulator layer 102, and a dielectric layer 107 formed over SOI layer 103. SOI layer 103 includes spaced-apart SOI islands 105-1 and 105-2 are surrounded by isolation regions 106-0 to 106-2 and are separated by an intervening isolation region 106-1. In one embodiment isolation regions 106-0 to 106-2 include shallow trench isolation (STI).

MOS transistors 110-1 and 110-2 are respectively fabricated in accordance with known SOI fabrication techniques on SOI islands 105-1 and 105-2, and are connected in series between first port P1 and second port P2. MOS transistor 110-1 includes an N-type source region 111-1 and an N-type drain region 112-1 separated by a P-type channel region 113-1 of (first) SOI island 105-1, and a polycrystalline silicon gate structure 115-1 is formed on a suitable gate oxide over channel region 113-1. MOS transistor 110-2 includes an N-type source region 111-2 and an N-type drain region 112-2 separated by a P-type channel region 113-2 of (second) SOI island 105-2, with a polycrystalline silicon gate structure 115-2 formed over channel region 113-2. In an exemplary embodiment, each MOS transistor 110-1 and 110-2 has a length LMOS of approximately 0.3 µm, and a width $W_{MOS}$ in the range of 2 to 5 mm. Additional structures and features of MOS transistors 110-1 and 110-2 are shown but not specifically mentioned for brevity. Source region 111-1 of (first) MOS transistor 110-1 is coupled to antenna 90 by way of contact via structures 108-0 and additional metallization and/or wiring (not shown). Drain region 112-2 of (second) MOS transistor 110-2 is coupled to transceiver 95 by way of contact via structures 108-3 and additional metallization and/or wiring (not shown).

Referring to upper right corner of FIG. 1, the dashed-line bubble provides a cross-sectional view including graphic representations indicating an ON resistance $R_{MOS-ON}$ and the various capacitances making up an OFF-capacitance $C_{MOS-OFF}$ for MOS transistor 110-2. ON resistance $R_{MOS-ON}$ is the resistance across SOI island 105-2 (i.e., between metal via structures 118-2 and 118-3) when a suitable switch control signal $V_{MOS-ON}$ is applied to gate structure 115-2. OFF-capacitance $C_{MOS-OFF}$ is a sum of the various capacitances depicted in FIG. 3(A), including capacitances between metallization lines $C_{METAL}$, the capacitances of source/drain junctions to the body, Miller capacitances and capacitances connected to source and drain. For MOS transistors formed using the state of the art CMOS SOI technology (i.e., 0.18 µm or lower), a typical ON resistance $R_{MOS-ON}$ is on the order of 1 Ohm per mm, and $C_{MOS-OFF}$ is approximately 100 to 150 fF/mm, with metallization line capacitance $C_{METAL}$ comprising approximately 40 to 50% of the total capacitance.

Switching elements 120-1 to 120-4 comprise a Phase Change Material (PCM) or another resistance switching material that is readily convertible between a high OFF-resistance state and a low ON-resistance state, and are connected in parallel between drain region (terminal) 112-1 of (first) MOS transistor 110-1 and source region (terminal) 111-2 of (second) MOS transistor 110-2. According to an aspect of the present invention, each switching element 120-1 to 120-4 is configured such that a ratio of its OFF-resistance $R_{OFF}$ to its ON-resistance is greater than 1,000. Referring to the bubble at the top of FIG. 1, in a presently preferred embodiment each switching element 120-1 to 120-4 (e.g., switching element 120-4) includes a Phase Change Material (PCM) structure 125 connected between two electrodes 121 and 122, where PCM structure 125 is configured to convert between a low-resistance crystalline state and a high-resistance amorphous state in response to corresponding heat profiles such as those set forth in the background section above. In one embodiment, PCM structures 125 are fabricated using a suitable material (e.g., a chalcogenide glass) and configured to exhibit an ON-resistance $R_{PCM-ON}$ (i.e., resistance in their low-resistance crystalline state) of approximately 1 Ohm, and an OFF-resistance (i.e., resistance in their high-resistance amorphous state) set such that a ratio of the OFF-resistance to their ON-resistance has a value equal to or greater than 10,000. In addition, PCM structures are preferably formed with an OFF-capacitance $C_{PCM-OFF}$ of approximately 20 fF or lower, where OFF-capacitance $C_{PCM-OFF}$ is generated by parasitic capacitances including capacitances between metallization line segments 109-1 and 109-2, and also capacitances generated by the PCM cell electrodes. Switching elements (also referred to herein as PCM cells) 120-1 to 120-4 with PCM structures 125 having these performance characteristics (e.g., may be fabricated using GeTe with lengths $L_{PCM}$ of approximately 2 µm and widths $W_{PCM}$ of approximately 30 µm. Switching elements 120-1 to 120-4 are fabricated on a portion 107-1 of dielectric layer 107 that is disposed over intervening isolation region 106-1 (i.e., such that switching elements 120-1 to 120-4 are between MOS transistors 110-1 and 110-2 in a top plan view). Switching elements 120-1 to 120-4 are connected in parallel between drain region 112-1 and source region 111-2 by way of contact via structures 108-1 and 108-2 and first metal (Metal 1) structures 109-1 and 109-2.

Figure 1A:
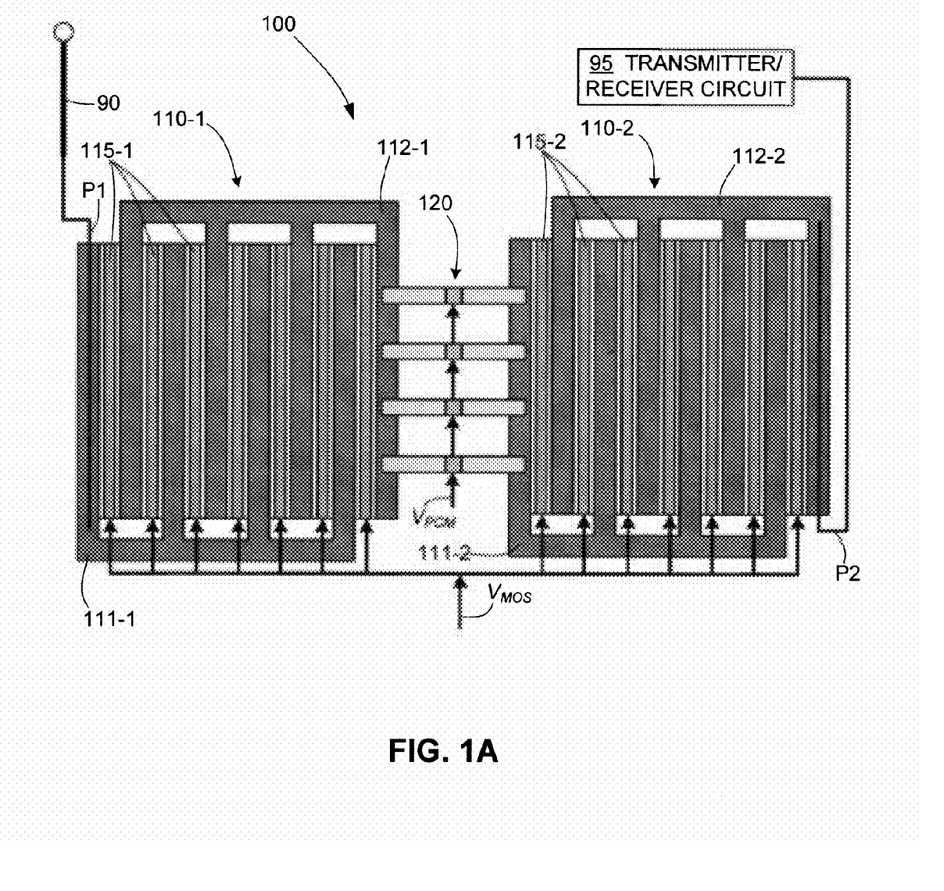
FIG. 1A is a top plan view showing the hybrid MOS-PCM switch of FIG. 1 according to an exemplary practical embodiment.

Note that hybrid MOS-PCM switch 100 is depicted in a simplified schematic form in FIG. 1 to highlight certain novel aspects of the present invention. FIG. 1A shows hybrid MOS-PCM switch 100 according to an exemplary practical embodiment in which MOS transistors 110-1 and 110-2 are implemented using an interdigitated arrangement (i.e., as opposed to the simplified straight-line arrangement depicted in FIG. 1). Specifically, source region 111-1 and drain region 112-1 of MOS transistor 110-1 include four parallel interdigitated finger segments that extend from corresponding base sections, and gate structure 115-1 includes parallel sections that are disposed over channel regions separating adjacent pairs of source/drain finger segments. Similarly, each of source region 111-2 and drain region 112-2 of MOS transistor 110-2 includes four parallel interdigitated finger segments, and gate structure 115-2 includes parallel sections disposed between adjacent pairs of these source/drain finger segments. This interdigitated arrangement is used to make the switch layout more compact, and PCM-based switch elements 120 are connected in parallel between the rightmost finger segment of drain region 112-1 and the leftmost finger segment of source region 111-2, as indicated in FIG. 1A.

Figure 2A:
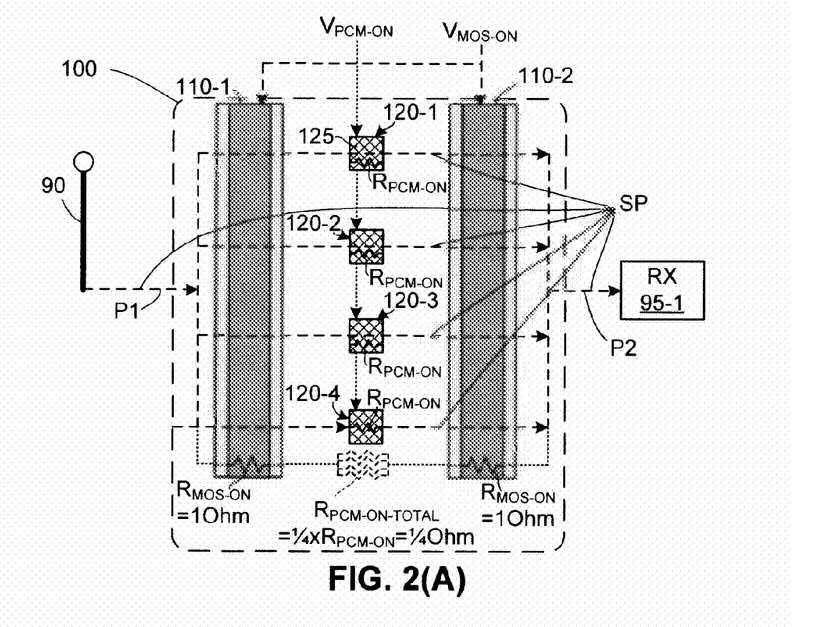
FIGS. 2(A) and 2(B) are simplified top plan views depicting the hybrid MOS-PCM switch of FIG. 1 during operation.
Figure 2B:
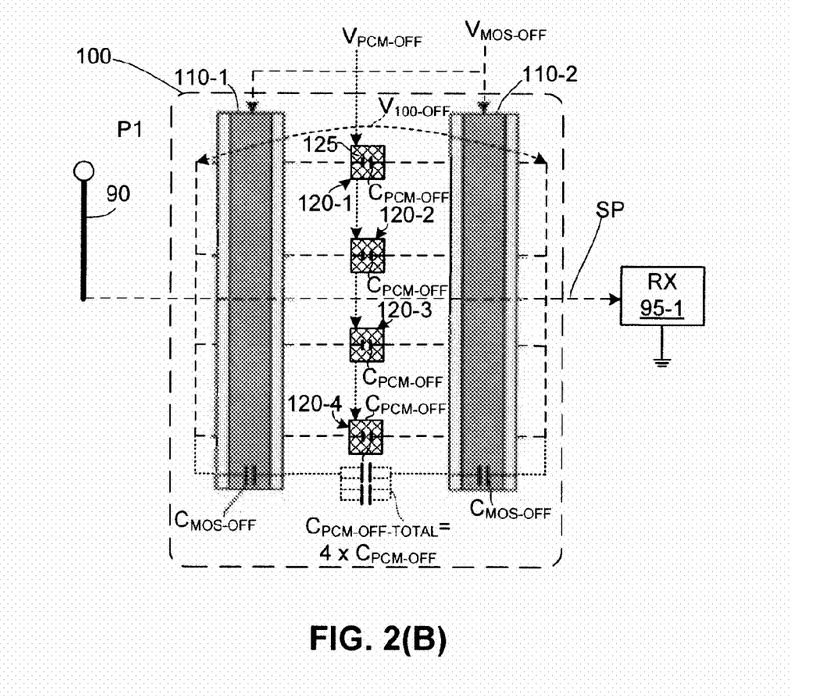

FIGS. 2(A) and 2(B) are simplified top plan views depicting hybrid MOS-PCM switch 100 during ON and OFF operating states, respectively. Referring to FIG. 2(A), to configure switch 100 in the ON state, a PMC-ON switch control signal $V_{PCM-ON}$ is supplied to parallel-connected switching elements 120-1 to 120-4, and a MOS-ON switch control signal (gate voltage) $V_{MOS-ON}$ is supplied to MOS transistors 110-1 and 110-2. PMC-ON control signal $V_{PCM-ON}$ is operable to generate a heating profile that causes PCM structure 125 of each switching elements 120-1 to 120-4 to enter a low-resistance (crystalline) state, and MOS-ON control signal $V_{MOS-ON}$ is set at a level that facilitates passage of signals through MOS transistors 110-1 and 110-2. With both switching structures 120-1 to 120-4 and MOS transistors 110-1 and 110-2 in low resistance states, signals are passed from antenna 90 to receiver circuit 95-1 with relatively low impedance along a signal path SP that extends from port P1, through MOS transistor 110-1, through parallel connected switching elements 120-1 to 120-4, and through MOS transistor 110-2 to port P2. Referring to FIG. 2(B), subsequent transition of switch 100 to an OFF state involves applying a PCM-OFF (third) control signal $V_{PCM-OFF}$ to the parallel-connected switching elements 120-1 to 120-4 that operably causes their respective PCM structures 125 to enter their high-resistance (amorphous) state, and by applying a MOS-OFF V MOS-OFF control signal (gate voltage) that turns off MOS transistors 110-1 and 110-2, whereby IC switch 100 impedes signal transmissions along the signal path SP between antenna 90 and receiver circuit 95-1.

Referring again to FIGS. 2(A) and 2(B), hybrid MOS-PCM switch 100 achieves improved (lower) FOM in comparison to conventional MOS-only RF switches by way of utilizing PCM-based switching elements (PCM cells) 120-1 to 120-4 in place of a MOS transistor to reduce the total ON-resistance $R_{ON}$ of switch 100 (i.e., in comparison to a conventional three MOS switch) while maintaining or reducing OFF-capacitance $C_{OFF}$. Considering a unit element of hybrid MOS-PCM switch as a serial connection of a MOS transistor and a group of PCM cells placed per mm of the gate length, the FOM of hybrid MOS-PCM switch 100 is calculated by multiplying its average OFF-capacitance $C_{OFF}$ and its average ON-resistance $R_{ON}$, where $C_{OFF}$ is typically measured in femto-Farads per millimeter (fF/mm) of gate width, and $R_{ON}$ is typically measured in Ohms per 1 mm of gate width of MOS transistor comprising the MOS-PCM switch, and $R_{ON}$ is typically measured in Ohms per 1 mm of gate width. Similar to the case of standard SOI RF switches comprised of MOS transistors only, the FOM value indicates the quality of switch 100 by reflecting insertion losses in its ON state, depicted in FIG. 2(A), and isolation in its OFF state, depicted in FIG. 2(B). Referring to FIG. 2(A), where 4 PCM cells are placed per 1 mm of MOS transistor width, utilizing parallel-connected PCM cells 120-1 to 120-4 serves to reduce the ON-resistance of switch 100 because the total resistance $R_{PCM-ON-TOTAL}$ of the four parallel-connected PCM cells 120-1 to 120-4 is one-fourth of their individual ON-resistance values (i.e., 0.25 times 1 Ohm, which equals 0.25 Ohm). By replacing the 1 Ohm resistance of a MOS transistor with the 0.25 Ohm total resistance of parallel-connected PCM cells 120-1 to 120-4, the average ON-resistance of the switch 100 (normalized to one MOS transistor of a standard prior art switch branch) is reduced from 1 Ohm*mm to 1.25/2=0.63 Ohm*mm (i.e., where a MOS transistor connected to four parallel-connected PCM cells represents a unit element of the antenna branch). Similarly, by replacing the 100 fF capacitance of a MOS transistor with the 80 fF total capacitance of parallel-connected PCM cells 120-1 to 120-4, the average capacitance of a unit element (normalized to one transistor of conventional prior art MOS antenna branch) is decreased from 100 fF/mm to approximately 88 fF/mm. In this manner, hybrid MOS-PCM switch 100 achieves a strongly improved Figure of Merit (FOM) over conventional MOS-only switches: in the example with four PCM cells, FOM drops from 1 Ohm*mm×100 fF/mm (i.e., an FOM equal to 100) to 0.63 Ohm*mm×88 fF/mm (i.e., an FOM of approximately 55, which represents nearly a 50% reduction, which is an approximately two-times improvement over conventional MOS-only switches).

Figure 3A:
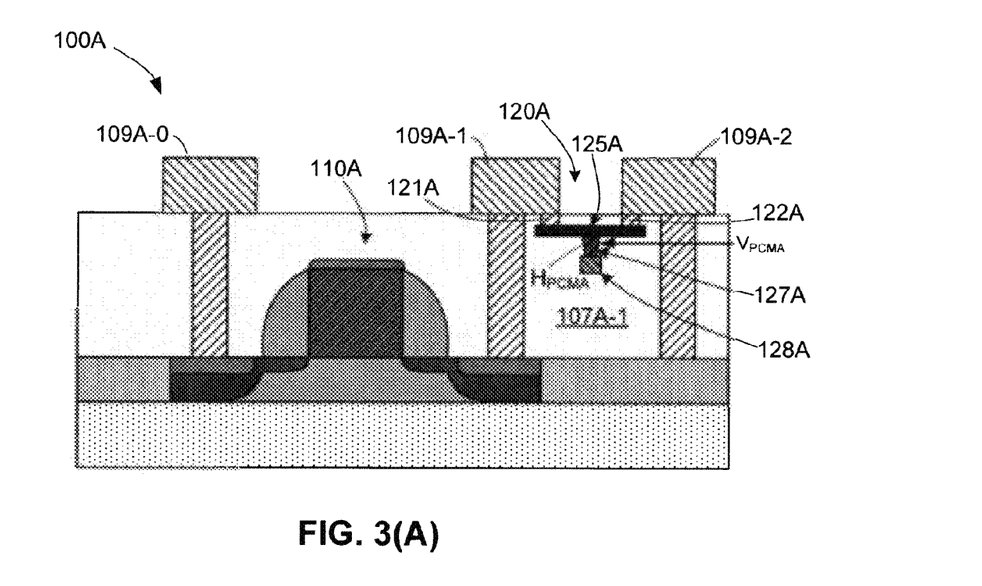
FIGS. 3(A) and 3(B) are cross-sectional side views showing partial hybrid MOS-PCM switches according to alternative specific embodiments of the present invention.
Figure 3B:
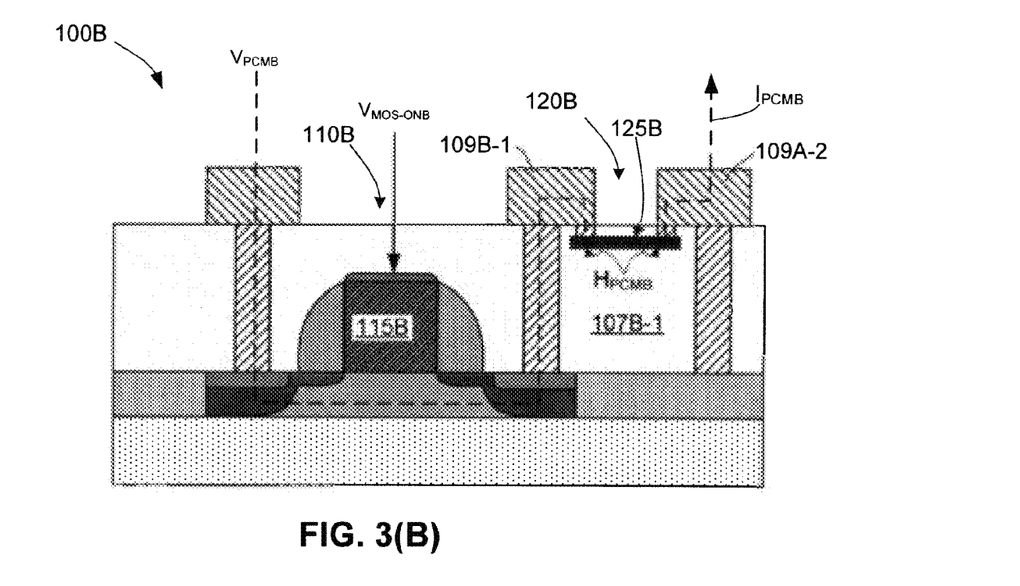

FIGS. 3(A) and 3(B) are cross-sectional side views showing hybrid MOS-PCM switches according to alternative specific embodiments of the present invention. For descriptive purposes, the switches shown in FIGS. 3(A) to 3(D) depict only one PCM cell, although it is understood that the depicted PCM cell indicates a PCM cell group including multiple (e.g., two to ten) parallel-connected PCM cells in the manner described above with reference to FIGS. 1 and 2(A). In addition, the switches shown in FIGS. 3(A) and 3(B) are depicted using only one MOS transistor and only one parallel-connected PCM cell group for brevity, and that each switch may include any number of MOS transistors and parallel-connected PCM cell groups.

FIG. 3(A) shows a hybrid MOS-PCM switch 100A including a MOS transistor 110A and an indirect-heating-type PCM cell 120A, where MOS transistor 110A is coupled between metallization structure 109A-0 and 109A-1 in the manner described above, and indirect-heating-type PCM cell 120A is formed on a dielectric layer portion 107A-1 and coupled to a drain terminal of MOS transistor 110A by way of metallization structure 109A-1. Indirect-heating-type PCM cell 120A includes a chalcogenide glass member (switching structure) 125A connected to metallization structure 109A-1 by way of an electrode 121A and to a metallization structure 109A-2 by way of a second electrode 122A, where chalcogenide glass member 125A (e.g., GeTe) is operably configured an disposed over a heater element 127A such that heat $H_{PCMA}$ generated by heater element 127A is transmitted to chalcogenide glass member 125A, and has a heat profile (i.e., temperature and duration) operably configured to cause switching of member 125A into a desired conductive state (e.g., either from an amorphous to a crystalline state, or from the crystalline state to the amorphous state). In this case, heater element 127A is configured to generate appropriate heat profile $H_{PCMA}$ in response to an applied switch control signal $V_{PCMA}$ that is transmitted from a switch control circuit (not shown) during ON-to-OFF or OFF-to-ON switching operations. In a specific embodiment, heater element 127A comprises a Tungsten (W) element, and PCM cell 120A also includes a thermally conductive material structure 128A (e.g., Aluminum-Nitride or other thermally conductive dielectric material) disposed under heater element 127A and switching structure 125A that serves to dissipate heat $H_{PCMA}$ from member 125A.

FIG. 3(B) shows a second hybrid MOS-PCM switch 100B including a MOS transistor 110B and a direct-heating-type PCM cell 120B. As in the previous embodiments, MOS transistor 110B is coupled between metallization structures, and direct-heating-type PCM cell 120B is formed on a dielectric layer portion 107B-1 and coupled to a drain terminal of MOS transistor 110B by way of an intervening metallization structure 109B-1. In this embodiment, direct-heating-type PCM cell 120B comprises a chalcogenide glass member 125B that is configured to transform between amorphous and crystalline states in response to a corresponding switching voltage pulses $V_{PCMB}$ that are applied such that corresponding current pulses $I_{PCMB}$ pass through member 125B in the manner indicated by the dash-line arrow in FIG. 3(B). According to presently preferred embodiment, switching voltage pulses $V_{PCMB}$ are passed to direct-heating-type PCM cell 120B from adjacent (associated) MOS transistor 110B. That is, the design of hybrid MOS-PCM switch 100B facilitates the use of MOS transistor 110B as a driver to supply switching voltage pulses (switch control signal) $V_{PCMB}$ to PCM cell 120B, which simplifies the overall circuit design by way of obviating the need for separate power MOSFETs (i.e., which function in conventional PCM-based switches solely to supply switching voltage pulses). As indicated in FIG. 3(B), utilizing MOS transistor 110B as a driver is achieved by applying a positive voltage $V_{MOS\text{-}ONB}$ to gate 115B, whereby MOS transistors 110B passes voltage pulses $V_{PCMB}$ to PCM cell 120B.

Although FIGS. 3(A) and 3(B) illustrate currently preferred PCM cell configurations, other PCM cell types and configurations may also be utilized. For example, although PCM cells 120A and 120B (FIGS. 3(A) and 3(B) are depicted as being fabricated using a horizontal/planar configuration, a vertical configuration may be utilized in which a chalcogenide glass member (e.g., GeTe film) is placed on top of a via electrode (e.g., W), and connected from above by a second electrode (e.g., metallization/Aluminum). In another possible embodiment, the PCM cells 120D may be formed using a nanowire configuration.

Figure 4A:
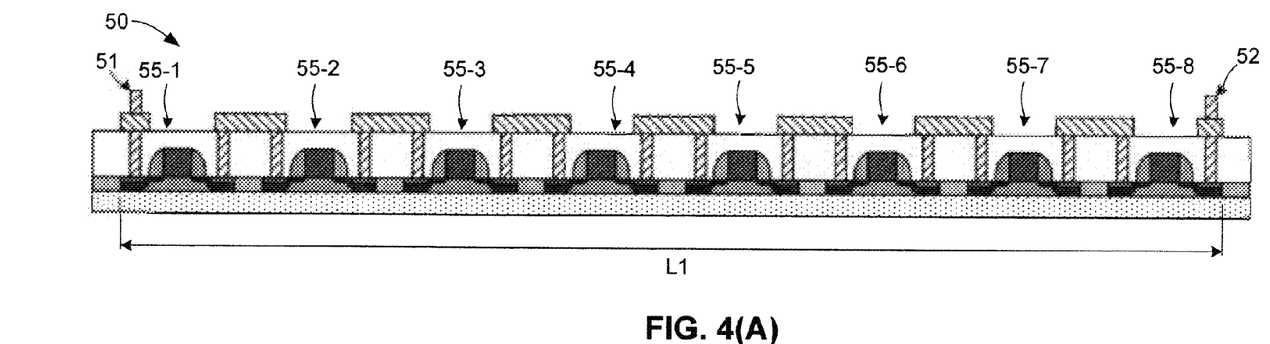
FIGS. 4(A) and 4(B) are cross-sectional side views showing a conventional MOS-only RF switch and a comparable hybrid MOS-PCM RF switch according to another exemplary embodiment of the present invention.
Figure 4B:
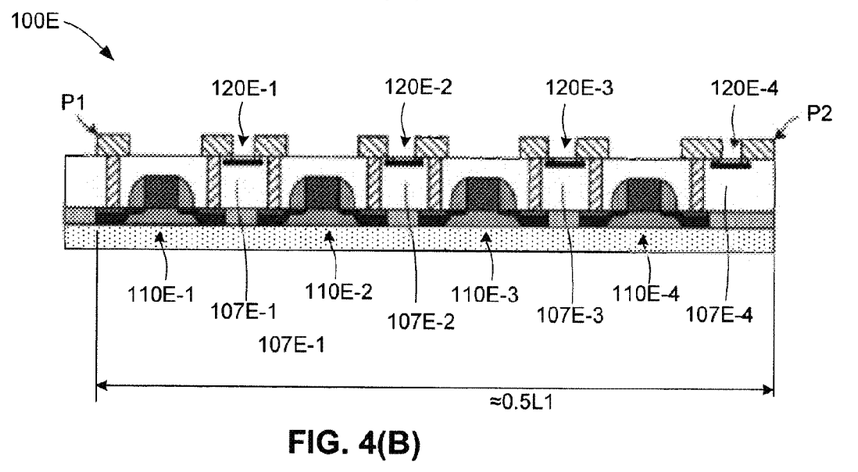
Figure 5A:
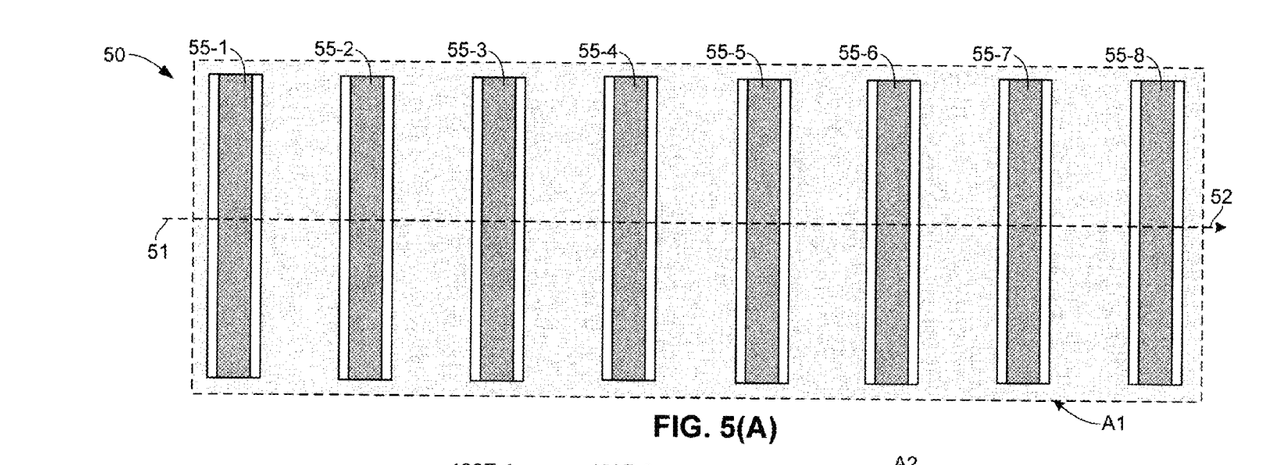
Figure 5B:
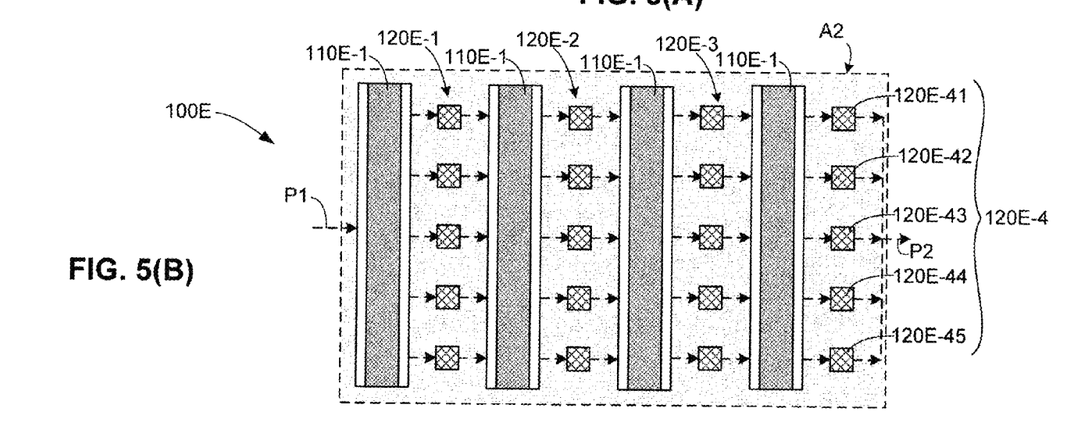

FIGS. 4(A) to 5(B) provide an example showing a conventional MOS-only switch 50 and a comparable hybrid MOS-PCM switch 100E, where FIGS. 4(A) and 4(B) are cross-sectional side views showing conventional MOS-only RF switch 50 and comparable hybrid MOS-PCM RF switch 100E, and FIGS. 5(A) and 5(B) are top plan views showing conventional MOS-only switch 50 and hybrid MOS-PCM RF switch 100E, respectively. Note that the drawings are schematic, and that actual transistors comprising conventional switches have interdigitated layouts (i.e., penetrating fingers of source an drain regions connected at opposite sides, as shown in FIG. 1). Hybrid MOS-PCM RF switch 100E is comparable to conventional MOS-only switch 50 in that both switches are configured to withstand 25V VSWR, and as such hybrid MOS-PCM RF switch 100E may be utilized in place of conventional MOS-only switch 50 in an integrated circuit design. However, as set forth below, hybrid MOS-PCM RF switch 100E uses only half of the MOS transistors required by conventional MOS-only switch 50, and utilizes PCM cell groups that allow hybrid MOS-PCM RF switch 100E to achieve a significantly improved FOM using a significantly smaller footprint (i.e., approximately 50% smaller) without compromising high power RF handling and high power consumption in switching.

Referring to FIG. 4(A), conventional switch 50 includes eight SOI MOS transistors 55-1 to 55-8 similar to those described above and connected in series between a first port 51 and a second port 52. In this example, each MOS transistor 55-1 to 55-8 is a 2.5V device fabricated using 0.18 µm CMOS SOI technology with an approximately 50 Å gate dielectric, having a channel length equal to 0.3 µm, and is fabricated with a BVDSS of 3.5V. Referring to FIG. 5(A), each MOS transistor 55-1 to 55-8 has a channel width W equal to 5 mm, and conventional switch 50 has a chip-area size A1 of approximately 10 mm²). Those skilled in the art understand that, in order to withstand 25V VSWR using the above-mentioned 0.18 µm CMOS SOI technology, conventional switch 50 requires all eight MOS transistors 55-1 to 55-8.

Referring to FIG. 4(B), hybrid MOS-PCM switch 100E includes four SOI MOS transistors 110E-1 to 110E-4 and four PCM cell groups 120E-1 to 120E-4. Each MOS transistor 110E-1 to 110E-4 is fabricated substantially identically to SOI MOS transistors 55-1 to 55-8 (i.e., each is a 2.5V device fabricated using 0.18 µm CMOS SOI technology with channel length L and BVDSS of 3.5V), and PCM cell groups 120E-1 to 120E-4 are respectively formed on corresponding dielectric layer portions 107E-1 to 107E-4 that are respectively disposed adjacent to MOS transistors 110E-1 to 110E-4. Specifically, PCM cell group 120E-1 is disposed on dielectric layer portion 107E-1 and connected between MOS transistors 110E-1 and 110E-2, PCM cell group 120E-2 is disposed on dielectric layer portion 107E-2 and connected between MOS transistors 110E-2 and 110E-3, and PCM cell group 120E-3 is disposed on dielectric layer portion 107E-3 and connected between MOS transistors 110E-3 and 110E-4. Fourth PCM cell group 120E-4 is disposed on dielectric layer portion 107E-3 and connected between MOS transistor 110E-4 and port P2 of switch 100E. As depicted in FIG. 5(B), each PCM cell group 120E-1 to 120E-4 includes five parallel connected PCM cells (e.g., PCM group 120E-4 includes parallel-connected PCM cells 120E-41 to 120E-45). An advantage of this arrangement is that, due to the smaller size of parallel-connected PCM cells, each PCM cell group 120E-1 to 120E-3 can be disposed between adjacent MOS transistors 110E-1 and 110E-2 without requiring an increase in the transistor-to-transistor spacing separating the adjacent pairs of MOS transistors. For example, the five parallel-connected PCM cells of PCM cell group 120E-1 are implemented between adjacent MOS transistors 110E-1 and 110E-2 Accordingly, hybrid MOS-PCM RF switch 100E effectively facilitates the omission (removal) of half of the series connected MOS transistors required in by conventional MOS-only switch 50, resulting in a chip-area size A2 that is approximately 50% smaller than chip area A1 of conventional switch 50. Moreover, replacing the omitted MOS transistors with parallel-connected PCM cell groups significantly reduces the switch's total $R_{ON}$ while maintaining the same or smaller effective $C_{OFF}$ for reasons explained above. That is, due to five parallel-connected PCM cells in each PCM cell group 120E-1 to 120E-4, each group generates an $R_{ON}$ of 0.2 Ohms (i.e., 1 Ohm divided by five cells), and produces a $C_{OFF}$ of 100 fF/mm (i.e., five times 20 fF/mm). By replacing one-half of the MOS transistors used in conventional MOS-only switch 50 with PCM cell groups 120E-1 to 120E-4, hybrid MOS-PCM switch 100E achieves an approximately 50% reduction in FOM in comparison to the comparable conventional MOS-only switch without compromising high power RF handling and high power consumption in switching.

In a presently preferred embodiment, the PCM cells (e.g., PCM cells 120E-41 to 120E-45) are configured such that their OFF-state threshold voltage $V_{TH\text{-}PCM}$ is lower than the BVDSS (first voltage level) of MOS transistors 110E-1 to 110E-4. That is, when switch 100E is in the OFF state, each PCM cell in groups 120E-1 to 120E-4 is biased (i.e., turns on) to conduct current only when a voltage across the PCM cell group rises above the cells' OFF-state threshold voltage $V_{TH-PCM}$, which is set at a (second) voltage level (e.g., 3V) that is lower than the BVDSS (e.g., 3.5V) of MOS transistors 110E-1 to 110E-4. With this arrangement, in addition to improved FOM, hybrid MOS-PCM switch 100E achieves improved performance over conventional switch 50 in that, when hybrid MOS-PCM switch 100E is in the OFF state, PCM cells 120E-1 to 120E-4 are more immune to voltage overshoots, as compared with the serial connection of PCM cells utilized in comparable conventional PCM-only switches (not shown). If the voltage drop across a given PCM cell group 120E-1 to 120E-3 at 100 fF approaches threshold voltage $V_{TH-PCM}$ (i.e., 3V in the depicted example), the conductivity of that PCM cell increases, and the applied voltage is redistributed on associated adjacent MOS transistors 110E-1 to 110E-4. Moreover, hybrid MOS-PCM switch 100E achieves better performance due to lower parasitic loss than that incurred by conventional MOS-only switch 50. That is, in the OFF state, the voltage distribution between MOS transistors 60 of conventional MOS-only switch 50 (see FIG. 4(A)) depends on current flow through the substrate 51. The larger branch height of conventional MOS-only switch 50 (i.e., larger total switch area) results in higher imbalance, and thus poor linearity (see, e.g., T. Y. Lee, S. Lee, "Modeling of SOI FET for RF switch application", 2010 IEEE Radio Frequency Integrated Circuits Symposium, pp. 479-482). In comparison, the more compact switch size of hybrid MOS-PCM switch 100E produces less substrate parasitic loss, and therefore hybrid MOS-PCM switch 100E exhibits a more uniform voltage distribution than that of conventional MOS-only switch 50. As such, PCM cell groups 120E-1 to 120E-4 and MOS transistors 110E-1 to 110E-4 function symbiotically as an Ovonix voltage limiter, with the off-state MOS transistors limiting the current through the PCM cells to prevent heating and switching into their low-resistance ON state.

In a presently preferred embodiment, switch 100E is configured using direct-heating-type PCM cells, and MOS transistors 110E-1 to 110E-4 are utilized as drivers to supply voltage pulses to the direct-heating-type PCM cells of groups 120E-1 to 120E-4 during ON/OFF switching operations. This driver function is achieved by applying a positive voltage to the gates of MOS transistors 110E-1 to 110E-4 (i.e., such that MOS transistors 110E-1 to 110E-4 are in the ON state), and supplying voltage pulses exceeding a switch control voltage $V_{PCM-ON} = n \times V_{TH-OFF}$ to the transceiver terminal (i.e., the receiver or transmitter node), where n-is the number of PCM cell groups in the switch/branch, and $V_{TH-OFF}$ is the OFF-state threshold voltage of the PCM cells. Applying this formula to exemplary switch 100E (i.e., where n=4 and $V_{TH-OFF}$ is approximately 3V), the required voltage $V_{PCM-ON}$ is on the order of 10V to 15V, which can be generated on a standard CMOS SOI chip without requiring additional masks. This provides an advantage over conventional direct-heating-type PCM-only switches because switching eight or more serially connected PCM groups would require a $V_{PCM-ON}$ approximately 25V, which cannot be generated on standard CMOS SOI chip without additional masks and special high-voltage (HV) circuitry.

Although hybrid MOS-PCM switch 100E is depicted as utilizing direct-heating-type PCM cells, it is also possible to generate the switch using indirect-heating-type PCM cells similar to those described above with reference to FIG. 3(A) while benefitting from the high immunity to voltage overshoot mentioned above. In this case, switching of the PCM cells' ON/OFF state can be performed by applying voltages to connected-in-parallel heater elements of each PCM cell group.

Figure 6:
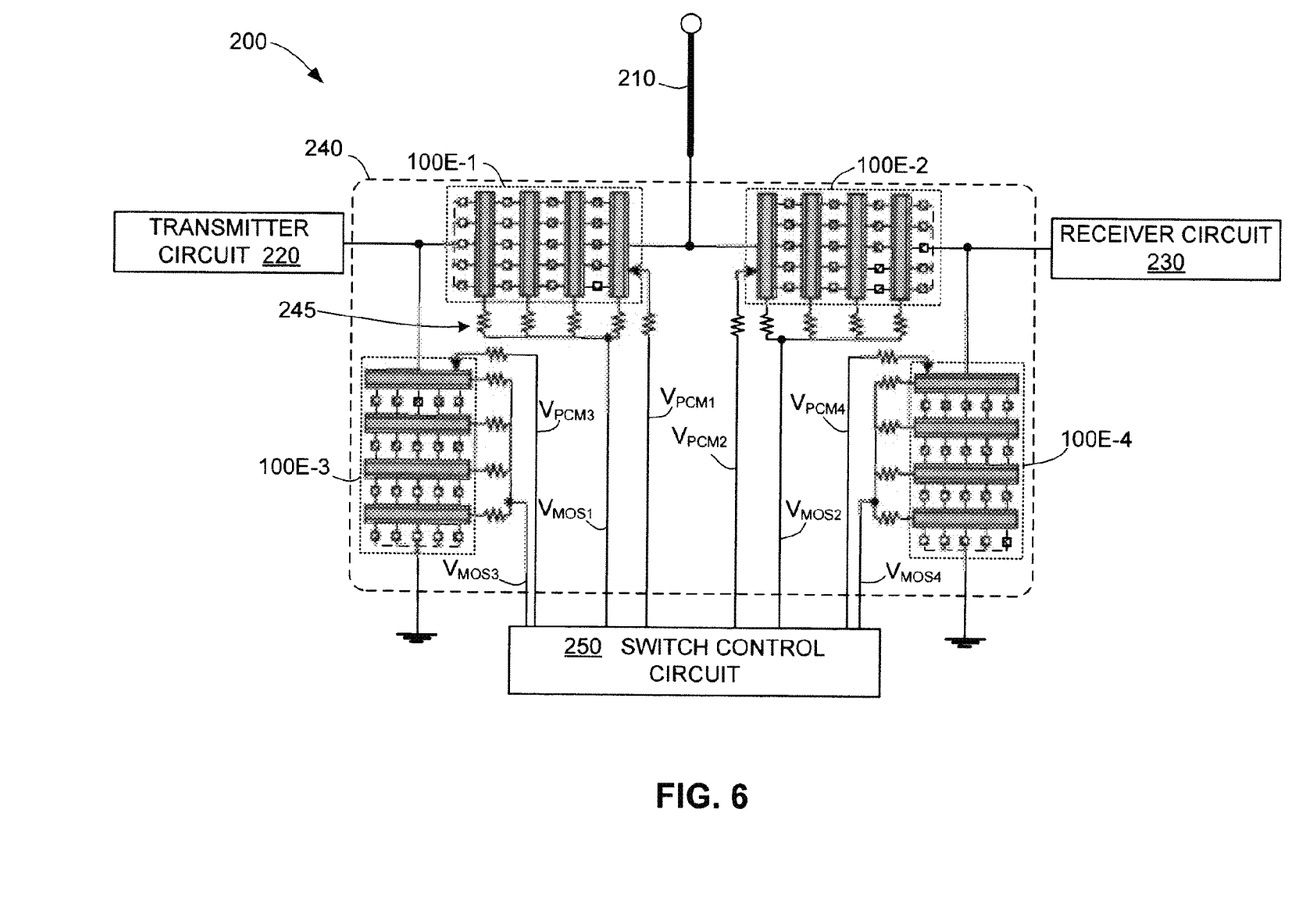
FIG. 6 is a simplified diagram showing an RF antenna assembly including a Single Pole, Double Throw RF switch according to another exemplary embodiment of the present invention.

FIG. 6 is a simplified diagram showing a system 200 including an antenna 210, a transmitter circuit 220, a receiver circuit 230, an antenna switch circuit 240 and a control circuit 250. Antenna switch circuit 240 is operably coupled between antenna 210, transmitter circuit 230 and receiver circuit 240 in a Single Pole, Double Throw (SPDT) configuration, and is controlled by control signals transmitted from control circuit 250 such that, in a transmission (first) operating state, antenna switch circuit 240 forms a low-resistance path between transmitter circuit 220 and antenna 210 and forms a high-resistance path between receiver circuit 230 and antenna 210, and such that, in a reception (second) operating state, antenna switch assembly 240 forms a low-resistance path between receiver circuit 230 and antenna 210 and forms a high-resistance path between transmitter circuit 220 and antenna 210.

Antenna switch circuit 240 includes four branches including two signal branches respectively controlled by hybrid MOS-PCM switch 100E-1 and 100E-2, and two shunt branches controlled by hybrid MOS-PCM switch 100E-3 and 100E-4, where hybrid MOS-PCM switches 100E-1 to 100E-4 are controlled using switch control signals generated by switch control circuit 250. The signal branch controlled by hybrid MOS-PCM switch 100E-1 is connected between antenna 210 and transmitter circuit 220, and the signal branch controlled by hybrid MOS-PCM switch 100E-2 is connected between antenna 210 and receiver circuit 220. Signal transmissions to and from antenna 210 on these two signal branches are controlled by turning on/off hybrid MOS-PCM switch 100E-1 by way of switch control signals $V_{MOS1}$ and $V_{PCM1}$, and by turning on/off hybrid MOS-PCM switch 100E-2 by way of switch control signals $V_{MOS2}$ and $V_{PCM2}$. The two shunt branches are utilized to increase isolation of the transmitter circuit 220 and receiver circuit 230 when not in use. The first shunt branch is connected between transmitter circuit 220 and ground and includes hybrid MOS-PCM switch 100E-3, which is controlled by way of switch control signals $V_{MOS3}$ and $V_{PCM3}$. The second shunt branch is connected between receiver circuit 230 and ground and includes hybrid MOS-PCM switch 100E-4, which is controlled by way of switch control signals $V_{MOS4}$ and $V_{PCM4}$.

To further improve isolation, the gates and sources/drains of the MOS transistors in each hybrid MOS-PCM switch 100E-1 to 100E-4 are biased negatively through large resistors 245 (e.g., polycrystalline silicon resistors having resistances in the range of 10 kOhm to 50 kOhm). Poly resistors 245 allow decoupling of RF and DC signals passed along the signal branches, and keep body and gate potentials in the MOS transistors near $V_{DS}/2$. With this arrangement, when large oscillating voltages are applied to the various branches (i.e., with voltage symmetrical with respect to the ground), the oscillating voltages are divided between the individual MOS transistors and PCM cell groups of each hybrid MOS-PCM switch 100E-1 to 100E-4.

During operation, system 200 alternately configures antenna switch circuit 240 for transmission and reception operations by way of utilizing switch control circuit 250 to control the operating state of hybrid MOS-PCM switches 100E-1 to 100E-4. To enter a transmission (first) operating state, switch control circuit 250 generates $V_{PCM1}$ to $V_{PCM4}$ and $V_{MOS1}$ to $V_{MOS4}$ such that switches 110E-1 and 110E-4 are turned on and switches 110E-2 and 110E-3 are turned off, thereby forming a low-resistance path between transmitter circuit 220 and antenna 210 through switch 110E-1, and isolating receiver circuit 230 from antenna 210 by way of turned-off switch 110E-2 (note that receiver circuit 230 is coupled to ground by way of turned-on switch 110E-4). To enter a reception (second) operating state, switch control circuit 250 generates $V_{PCM1}$ to $V_{PCM4}$ and $V_{MOS1}$ to $V_{MOS4}$ such that switches 110E-2 and 110E-3 are turned on and switches 110E-1 and 110E-4 are turned off, thereby forming a low-resistance path between receiver circuit 230 and antenna 210 through turned-on switch 110E-2, and isolating transmitter circuit 220 from antenna 210 by way of turned-off switch 110E-3 (note that transmitter circuit 220 is coupled to ground by way of turned-on state switch 110E-3). Transitions between on and off states are performed as described above.

Although the present invention has been described with respect to certain specific embodiments, it will be clear to those skilled in the art that the inventive features of the present invention are applicable to other embodiments as well, all of which are intended to fall within the scope of the present invention.

For example, although the present invention is described above with specific reference to CMOS SOI RF switches including chalcogenide-glass-type switching elements (e.g., GeTe-based PCM cells, which are shown to provide the desired $R_{OFF}/R_{ON}$ ratio of greater than 10,000), other switch types may be produced using configurations similar to those described above, and other switching element types may be used while remaining within the spirit and scope of the present invention.

In one alternative embodiment, one or both of transmission circuit 220 and receiver circuit 230 of system 200 (FIG. 6) includes multiple GSM frequency band circuits, wherein an associated switch branch configuration similar to that described above with reference to FIG. 6 is coupled between each GSM frequency band circuit and antenna 210.

In another alternative embodiment, switch devices having at least some of the features and associated benefits described above are fabricated on bulk semiconductor substrates (e.g., such that the MOS transistors are formed on monocrystalline silicon instead of SOI).

In addition, resistive random-access memory (ReRAM) devices utilize memristor-type switching elements that exhibit $R_{ON}$ and $C_{OFF}$ properties similar to those of the chalcogenide-glass-type PCM cells described above. In such cases, the various switch types described herein (e.g., RF switch 100, FIG. 1) may be produced as illustrated with ReRAM cells utilized as switching elements in place of the above-described PCM cells.

The invention claimed is:

1. An integrated circuit (IC) switch configured to control signals transmitted along a signal path, the switch comprising:
a plurality of Metal-Oxide-Silicon (MOS) transistors coupled in series in the signal path; and
a plurality of switching elements connected in parallel and disposed in the signal path, wherein each said switching element comprises a Phase Change Material (PCM) structure,
wherein said plurality of MOS transistors comprises a first MOS transistor fabricated on a first Silicon-On-Insulator (SOI) island and a second MOS transistor fabricated on a second Silicon-On-Insulator (SOI) island, said first and second SOI islands being separated by an intervening isolation region, and
wherein the plurality of switching elements are fabricated on a dielectric layer portion disposed over the intervening isolation region and are connected in parallel between a drain terminal of the first MOS transistor and a source terminal of the second MOS transistor.

2. An integrated circuit (IC) switch configured to control signals transmitted along a signal path, the switch comprising:
a plurality of Metal-Oxide-Silicon (MOS) transistors coupled in series in the signal path; and
a plurality of switching elements connected in parallel and disposed in the signal path, wherein each said switching element comprises a Phase Change Material (PCM) structure,
wherein each of the plurality of MOS transistors is configured to apply a first OFF-capacitance to the signal path when said each MOS transistor is in a high-resistance state,
wherein the plurality of switching elements are configured to collectively apply a second OFF-capacitance to the signal path when all of said plurality of switching elements are in a high-resistance state such that said second OFF-capacitance is substantially equal to or lower than said first OFF-state capacitance of said each MOS transistor.

3. The IC switch of claim 1, wherein the plurality of switching elements are configured such that a ratio of an OFF-resistance of each said switching element to an ON-resistance of said each switching element is greater than 1,000.

4. The IC switch of claim 1, wherein the PCM structure of each said switching structure comprises a chalcogenide glass member connected between two electrodes.

5. The IC switch of claim 4, wherein the chalcogenide glass member comprises Germanium and Tellurium.

6. The IC switch of claim 4, wherein each of the plurality of switching structures further comprises a heater element configured to transmit heat onto said chalcogenide glass member during switching operations in response to an applied switching voltage.

7. An integrated circuit (IC) switch configured to control signals transmitted along a signal path, the switch comprising:
a plurality of Metal-Oxide-Silicon (MOS) transistors coupled in series in the signal path; and
a plurality of switching elements connected in parallel and disposed in the signal path, wherein each said switching element comprises a Phase Change Material (PCM) structure,
wherein the PCM structure of each said switching structure comprises a chalcogenide glass member connected between two electrodes, wherein each of the plurality of switching structures further comprises a heater element configured to transmit heat onto said chalcogenide glass member during switching operations in response to an applied switching voltage, and
wherein said each switching element further comprises a thermally conductive material structure disposed under said heater element and said chalcogenide glass member.

8. The IC switch of claim 4, wherein said chalcogenide glass member of each of the plurality of switching structures is configured to transform between amorphous and crystalline states in response to corresponding applied switching voltages that are passed through said chalcogenide glass member from an associated MOS transistor of said plurality of MOS transistors.

9. The IC switch of claim 4, wherein each of the plurality of switching elements comprises one of a horizontal configuration, a vertical configuration, and a nanowire configuration.

10. The IC switch of claim 1,
wherein said plurality of switching elements includes a plurality of PCM cell groups, each said PCM cell group including multiple said PCM cells connected in parallel, and
wherein each of the plurality of MOS transistors is connected to at least one of said plurality of PCM cell groups.

11. An integrated circuit (IC) switch configured to control signals transmitted along a signal path, the switch comprising:
a plurality of Metal-Oxide-Silicon (MOS) transistors coupled in series in the signal path; and
a plurality of switching elements connected in parallel and disposed in the signal path, wherein each said switching element comprises a Phase Change Material (PCM) structure,
wherein said plurality of switching elements includes a plurality of PCM cell groups, each said PCM cell group including multiple said PCM cells connected in parallel,
wherein each of the plurality of MOS transistors is connected to at least one of said plurality of PCM cell groups,
wherein each of the plurality of MOS transistors is configured with a breakdown voltage that is above a first voltage level, and
wherein each of said plurality of PCM cells is configured such that said each PCM cell is biased to conduct current when a voltage across said each PCM cell is above a second voltage level that is lower than the first voltage level.

12. A system including:
an antenna;
a transmitter circuit;
an antenna switch circuit operably coupled between the antenna and the transmitter circuit such that, in a first operating state, said antenna switch circuit forms a low-resistance path between the transmitter circuit and the antenna, and such that, in a second operating state, said antenna switch circuit forms a high-resistance path between the transmitter circuit and the antenna, said antenna switch circuit including at least one branch comprising:
a plurality of Metal-Oxide-Silicon (MOS) transistors respectively fabricated on associated SOI islands such that each said SOI island is separated from one or more adjacent said SOI islands by an associated intervening isolation region; and
a plurality of Phase Change Material (PCM) cell groups disposed on a dielectric layer that is formed over the plurality of MOS transistors, each said PCM cell group including a plurality of PCM cells disposed on an associated region of said dielectric layer that is disposed between an associated pair said MOS transistors, wherein the plurality of PCM cells of said each PCM cell group are connected in parallel between a drain terminal of a first MOS transistor of said associated pair of MOS transistors and a source terminal of a second MOS transistor of said associated pair of MOS transistors.

13. The system of claim 12, further comprising a switch control circuit configured to generate MOS control signals that are applied to gate terminals of the MOS transistors and PCM control signals that are operably applied to the plurality of PCM cells.

14. The system of claim 12, wherein each said PCM cell comprises a chalcogenide glass member connected between two electrodes.

15. The system of claim 14, wherein each of the plurality of PCM cells further comprises a heater element configured to transmit heat onto said chalcogenide glass member during switching operations in response to an applied switching voltage.

16. The system of claim 15, wherein said each PCM cell further comprises a thermally conductive material structure disposed under one or more of said heater element and said chalcogenide glass member.

17. The system of claim 14, wherein said chalcogenide glass member of each of the plurality of PCM cells is configured to transform between amorphous and crystalline states in response to corresponding applied switching voltages that are passed through said chalcogenide glass member from an associated MOS transistor of said plurality of MOS transistors.

18. The system of claim 14,
wherein each of the plurality of MOS transistors is configured with a breakdown voltage that is above a first voltage level, and
wherein each of said plurality of PCM cells is configured such that said each PCM cell is biased to conduct current when a voltage across said each PCM cell is above a second voltage level that is lower than the first voltage level.

19. An integrated circuit switch comprising:
first and second Metal-Oxide-Silicon (MOS) transistors connected in series along a signal path; and
a plurality of switching elements connected in parallel between a drain terminal of said first MOS transistor and a source terminal of said second MOS transistor,
wherein each said switching element comprises one of a chalcogenide glass structure and a ReRAM element.

* * * * *